United States Patent
Theoduloz et al.

(10) Patent No.: US 7,772,886 B2
(45) Date of Patent: Aug. 10, 2010

(54) CONFIGURATION BACKUP DEVICE FOR THE TERMINALS OF AN INTEGRATED CIRCUIT AND METHOD OF ENABLING THE DEVICE

(75) Inventors: Yves Theoduloz, Yverdon (CH); Hugo Jaeggi, Fontaines (CH); Lubomir Plavec, Necin (CZ)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 12/502,572

(22) Filed: Jul. 14, 2009

(65) Prior Publication Data

US 2010/0013518 A1    Jan. 21, 2010

(30) Foreign Application Priority Data

Jul. 17, 2008    (EP) .................................. 08160648

(51) Int. Cl.
*H03K 19/094*    (2006.01)
(52) U.S. Cl. .......................................... 326/83; 326/80
(58) Field of Classification Search .............. 326/80–87
See application file for complete search history.

(56) References Cited

U.S. PATENT DOCUMENTS

| | | | |
|---|---|---|---|
| 6,107,832 A | 8/2000 | Taniguchi | |
| 6,323,687 B1 | 11/2001 | Yano | |
| 6,882,200 B2 | 4/2005 | Ahsanullah et al. | |
| 6,980,035 B1 | 12/2005 | Zhou et al. | |
| 7,586,339 B2 * | 9/2009 | Oh et al. ...................... | 327/108 |
| 2005/0068071 A1 * | 3/2005 | Waldrop ...................... | 327/112 |
| 2009/0284288 A1 * | 11/2009 | Zhang et al. ................ | 327/118 |

FOREIGN PATENT DOCUMENTS

JP    2003-295988 A    10/2003

* cited by examiner

*Primary Examiner*—Don P Le
(74) *Attorney, Agent, or Firm*—Sughrue Mion, PLLC

(57) ABSTRACT

The integrated circuit device (1) backs up the configuration of output terminals (O, $S_P$) of said integrated circuit in low-power mode. To do this, the device includes several voltage level shift units (2, 2', 2", 2''') and an output stage (3) connected to each output of the level shift units and connected to at least one external contact pad ($S_P$) of said integrated circuit. Each level shift unit includes an input stage powered by a regulated internal voltage ($V_{REG}$) and a part for transferring the state of a specific output function, which is powered by a supply voltage ($V_{DD}$) of the integrated circuit. Each level shift unit also includes a memory cell at output powered by the supply voltage, for storing the output state of a specific function of the level shift unit in the idle mode of the integrated circuit where the regulated voltage is cut off.

13 Claims, 3 Drawing Sheets

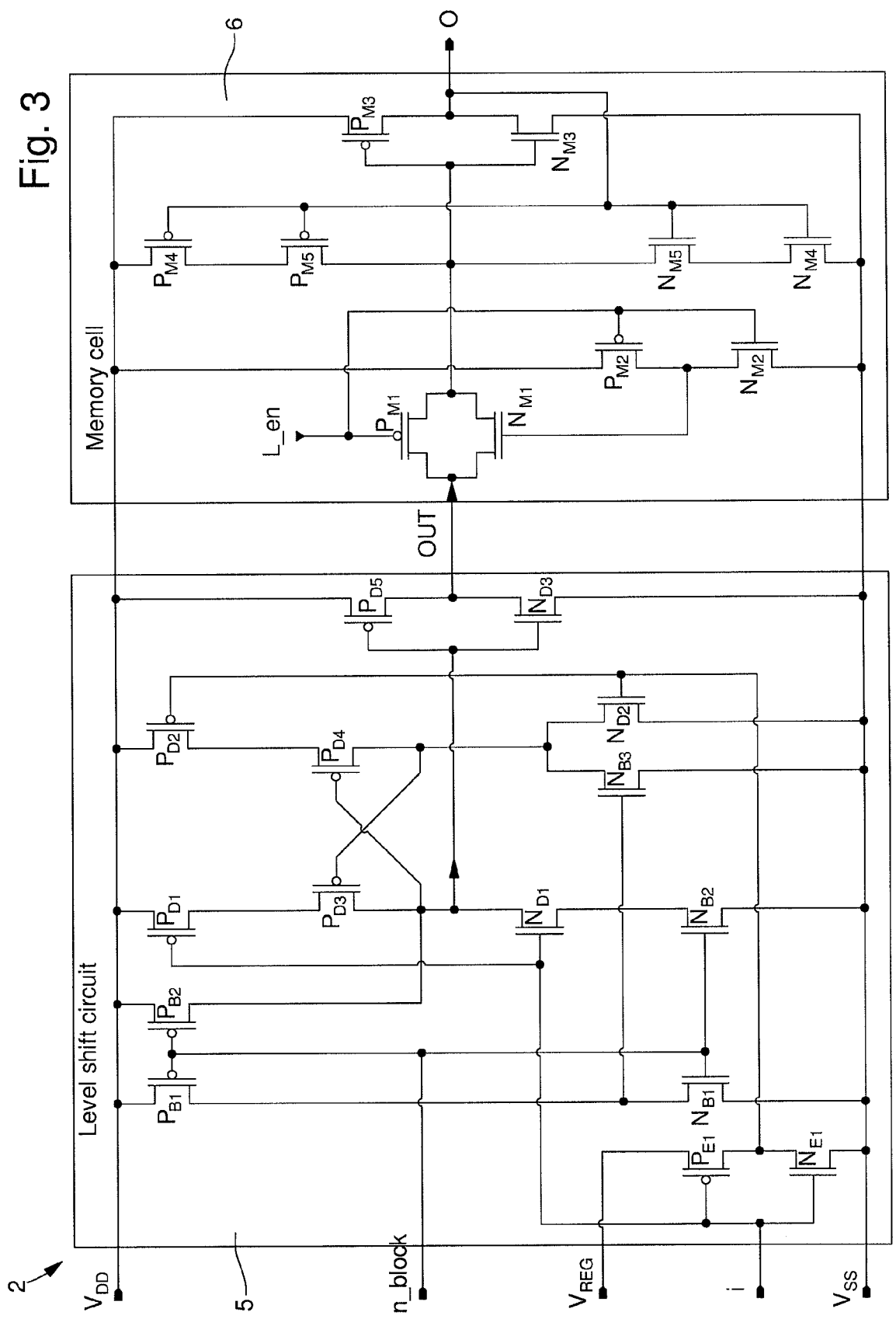

CONFIGURATION BACKUP DEVICE FOR THE TERMINALS OF AN INTEGRATED CIRCUIT AND METHOD OF ENABLING THE DEVICE

This application claims priority from European Patent Application No. 08160648.5 filed Jul. 17, 2008, the entire disclosure of which is incorporated herein by reference.

FIELD OF THE INVENTION

The invention concerns a configuration backup device for the terminals of a low-power integrated circuit. The backup device includes at least one voltage level shift unit, which includes a voltage level shift circuit and a memory cell. The voltage level shift circuit includes an input stage powered by an internal regulated voltage and an output function state transfer part, which is powered by a supply voltage of the integrated circuit. The backup device also includes an output stage powered by the supply voltage of the integrated circuit, which is connected to the output of the voltage level shift unit and connected to at least one external contact pad of the integrated circuit.

The invention also concerns a method of enabling the terminal configuration backup device for a low-power integrated circuit.

A "terminal" means any output terminal of the electronic units of an integrated circuit, and connection to an external contact pad of said integrated circuit.

BACKGROUND OF THE INVENTION

Usually, in order to be able to decrease the electric power consumption of an integrated circuit, for example in idle mode, various known electronic means exist. One could envisage, for example, cutting off the integrated circuit supply voltage. In this power down mode, the state of functions integrated in said integrated circuit is not longer guaranteed, which means that the output terminals lose their configuration. Certain specific precautions must therefore be taken from outside the integrated circuit to take care of any problems of incompatibility between the terminals. This may require the addition of a pull up element or pull down element.

JP Patent No. 2003-295988 discloses an integrated circuit fitted with means for reducing the electric power consumption of said integrated circuit in idle mode. In order to do this, the integrated circuit includes at least one voltage level shift unit, which is powered by a regulated internal voltage, and by a high supply voltage of the integrated circuit. The integrated circuit also includes a memory cell, between the voltage level shift unit and an external contact pad. Thus, the configuration of an output terminal is maintained in low-power mode by said memory cell.

In order to store the state of an output terminal of the integrated circuit in JP Patent No. 2003-295988, the integrated circuit software works in two steps. A first step is firstly to store the state of the output terminal in the memory cell, and a second step is to pass into low-power mode leaving the parts powered by the regulated internal voltage, which is disconnected, in a floating state. However, the proposed integrated circuit can only be applied to storing the state of a single output terminal. In the case of configuration backup for the output of several terminals relating to several specific functions, the integrated circuit would have to have several additional operating units. The addition of these operating units complicates the design of the integrated circuit, since good logic levels must be guaranteed in the integrated circuit for the passage from idle mode to normal operating mode.

In the U.S. Pat. No. 6,882,200, it is described an integrated circuit, which includes means for saving terminal state in output of the integrated circuit in an idle mode. In order to do this, it includes a logic circuit to provide control signals, which is powered by a regulated voltage, a voltage level shifter powered by a supply voltage of the integrated circuit, which is connected to the logic circuit to shift in voltage the state of control signals. The voltage level shifter is connected at output to two memory cells to store the state of two outputs of the voltage level shifter in an idle mode where the regulated voltage is cut off. The memory cells are connected to an output stage, which is connected to an external connection pad of the integrated circuit. However this document does not describe the possibility to save the output state of specific functions of several voltage level shifters.

SUMMARY OF THE INVENTION

It is thus an object of the invention to provide a configuration backup device for integrated circuit terminals in a low-power or idle mode that prevents excessive power consumption in the idle mode and overcomes the drawbacks of the aforecited state of the art.

The invention therefore concerns a terminal configuration backup device for a low-power integrated circuit of the type cited above, which is characterized in that the backup device includes several voltage level shift units connected to the output to the output stage, the voltage level shift units each including a memory cell powered by the supply voltage and controlled by a same storage signal, for storing the output voltage state of a specific function of the respective level shift unit in the idle mode of the integrated circuit where the regulated voltage is cut off.

Particular embodiments of the backup device are defined in the dependent claims 2 to 9.

One advantage of the backup device lies in the fact that in low-power or idle mode, each memory cell of the voltage level shift units stores the state of the corresponding output terminal. To do this, a storage signal is applied to each memory cell at the same time to command storage of the state of each output terminal of the level shift units. This storage signal has to occur before the passage from normal operating mode to idle mode.

An additional advantage of the backup device lies in the fact that in low-power or idle mode, blocking means are provided in the output state transfer part in each voltage level shift unit. These blocking means cut all of the transverse currents in the transfer part and can fix a defined output state for each unit. These transverse currents appear because the regulated internal voltage is placed in a floating state without guaranteeing blockage of all the transistors of each unit. Thus, floating transistor nodes remain in this transfer part, which may induce transverse currents. Owing to these blocking means there are only leakage currents from the elements powered by the integrated circuit supply voltage in idle mode.

The invention also concerns a method of enabling the aforementioned terminal configuration backup device for a low-power integrated circuit, the method including for the passage from a normal operating mode to an idle mode and inversely, the following steps:

enabling by means of a same storage signal the storage by each memory cell of the last output state of the output terminals of the voltage level shift units, enabling passage from normal operating mode to low-power or idle mode, wherein the regulated internal voltage is cut off or becomes floating, the last output state of the terminals being maintained by the enabled memory cells by the storage signal, waking up after a determined period of time or after an external command, the backup device for passage from idle mode to normal operating mode with the operating regulated voltage, the last output state of the output terminals being maintained by the memory cells enabled by the storage signal, and deactivating the storage signal to change, in accordance with the data or control signals, the output terminal configuration of each voltage level shift unit.

Particular steps in the method for enabling the read device are defined in the dependent claims 11 and 12.

One advantage of the method of enabling the backup device lies in the fact that once configuration of the voltage level shift unit output terminals has been stored, it is possible to pass into low-power mode. Each memory cell of said voltage level shift units maintains the output state until the backup device passes from idle mode to normal operating mode. In low-power mode, all of the transverse currents are eliminated in the voltage level shift units by blocking means, which guarantees low-power consumption for the integrated circuit.

BRIEF DESCRIPTION OF THE DRAWINGS

The objects, advantages and features of the terminal configuration backup device for a low-power integrated circuit and the method of enabling the same will appear more clearly in the following non-limiting description of at least one embodiment illustrated by the drawings, in which:

FIG. 3 shows a detailed embodiment of a voltage level shift unit that has a memory cell of the backup device according to the invention.

DETAILED DESCRIPTION OF THE INVENTION

In the following description, all of the parts of the terminal configuration backup device for a low-power integrated circuit, which are well know to those skilled in the art in this technical field will be explained in only a simplified manner.

Figure 1:
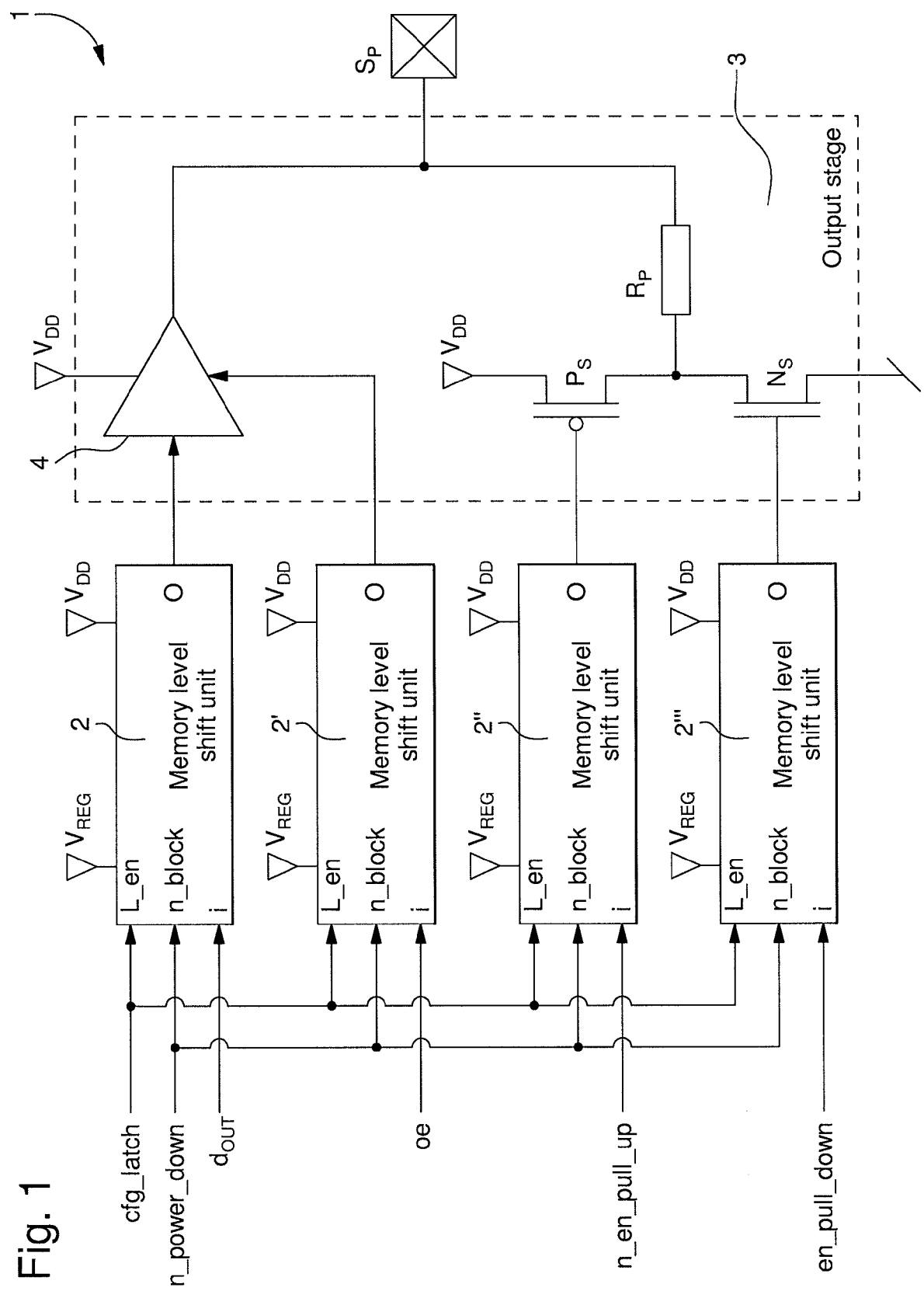
FIG. 1 shows in a simplified manner the elements of the integrated circuit terminal configuration backup device according to the invention.

FIG. 1 shows a configuration backup device 1 for the output terminals of an integrated circuit. This backup device includes a set of voltage level shift units 2, 2', 2" and 2'" and an output stage 3 arranged between each output O of each unit and at least one external contact pad $S_P$ of the integrated circuit. Each voltage level shift unit includes an input stage and a transfer part for the state of an output function, which are not shown. The input stage of each unit is powered by a regulated internal voltage $V_{REG}$, while the function state transfer part is always powered by the integrated circuit supply voltage $V_{DD}$, which may be at a higher or lower level than the regulated voltage. The internal regulated voltage can be generated by a voltage regulator, which is inside the integrated circuit.

The input stage is for receiving, at one input i, data or control signals $d_{OUT}$, oe, n_en_pull_up and en_pull_down relating to the function of each unit that is connected, via the output stage, to the external contact pad $S_P$. These data or control signals originate from a logic part of the integrated circuit that is not shown from the regulated internal voltage $V_{REG}$ field. The signals can be for example in a state "1" close to the internal regulated voltage or in a state "0" close to earth. The transfer part for a state of a function, which is dependent on a data or control signal i at input, allows the voltage shift at output O of the state of data or control signal.

In the configuration shown in FIG. 1, the backup device is capable of enabling the supply of output enable signals $d_{OUT}$ via a first level shift unit 2. The output O of this first level shift unit, which is from the integrated circuit supply voltage $V_{DD}$ field, is supplied to a tri-state buffer 4 of output stage 3, so as to transmit this data via external contact pad $S_P$. The tri-state buffer, which is powered by the integrated circuit supply voltage, is enabled by a control signal oe supplied at the input of a second level shift unit 2' and voltage shifted at output O of the second unit.

A third voltage level shift unit 2" is provided for the pull-up function of the external contact pad, while a fourth voltage level shift unit 2'" is provided for the pull-down function of external contact pad $S_P$. To do this, the output O of the third level shift unit 2" is connected to the gate of a PMOS transistor $P_S$ of output stage 3, while the output O of the fourth level shift unit 2'" is connected to the gate of an NMOS transistor $N_S$ of output stage 3. These two transistors are series-connected between the supply voltage $V_{DD}$ terminal and the earth terminal. The drain connection node of the two transistors $P_S$ and $N_S$ is connected via a load resistor $R_P$ to external contact pad $S_P$.

However, the third and fourth voltage level shift units must not perform the pull up or pull down during a data transfer by the first voltage level shift unit 2, when control signal oe is in state "1", for example close to $V_{REG}$. Moreover, when pull up is commanded by a control signal n_en_pull_up in state "0" by the third shift unit 2", transistor $P_S$ becomes conductive, whereas transistor $N_S$ has to remain non-conductive with the control signal en_pull_down in state "0". When pull down is commanded by a control signal en_pull_down in state "1" by the fourth shift unit 2'", transistor $N_S$ becomes conductive, while transistor $P_S$ has to remain non-conductive with the control signal n_en_pull_up in state "1", for example close to $V_{REG}$.

Care must be taken, during the passage from a pull up function to a pull down function or vice versa, that both transistors are not conductive. A pause time generally has to be observed in which the two transistors $P_S$ and $N_S$ are non-conductive prior to the desired change of function.

In addition to a conventional voltage level shift circuit, each voltage level shift unit for fulfilling a specific function includes a memory cell, which is not shown in FIG. 1. This memory cell is controlled by the storage signal cfg_latch supplied to input L_en of each unit so as to maintain the state of output terminal O of each unit prior to passage into idle mode. This storage signal and the memory cell are from the domain of the integrated circuit supply voltage $V_{DD}$, which is always active in idle mode and in the normal operating mode of the integrated circuit.

In order to remove any transverse currents during passage into idle mode after the state of each output terminal has been stored via each memory cell, each shift unit 2, 2' 2", 2'" further includes blocking means (not shown), which operate within the domain of supply voltage $V_{DD}$. A blocking signal n_power_down is supplied at the same time to each entry n_block of each level shift unit. Because of these blocking means, the only currents remaining in idle mode are leakage currents from the elements powered by the integrated circuit supply voltage.

Normally, as described with reference to FIG. 3 below, the blocking means become active when the signal n_block is in state "0". In the normal integrated circuit operating mode, this signal n_block must however be in state "1" for example close to $V_{DD}$. This allows a data or control signal transfer by the voltage level shift unit from the regulated voltage $V_{REG}$ domain to the supply voltage $V_{DD}$ domain.

Although only four voltage level shift units are shown in FIG. 1, it is entirely conceivable to add some more voltage level shift units in parallel. One or several voltage level shift units may be provided for example for input enable by external contact pad $S_P$. Consequently, in conjunction with the external contact pad of the integrated circuit, a digital data output, a digital pull up or pull down output, an open drain state and a tri-state analogue buffer may also be provided. However, to avoid overloading FIG. 1, only four shift units have been shown and described.

The method of enabling the configuration backup device for integrated circuit output terminals can be described for passage from normal operating mode to idle mode and vice versa. In a first step in normal operating mode, storage signal L_en has to pass from state "0" to state "1" to command the storage operation by the memory cells of the last output state of each voltage level shift unit. Once this storage signal L_en is in state "1", any change in input signal i no longer has any influence on the output state of each shift unit 2, 2', 2", 2'".

In a second step of the method, the integrated circuit logic commands passage from normal operating mode to low-power or idle mode. In this idle mode the regulated internal voltage is cut off or becomes floating, which leads to a reduction in the electric power consumption of the integrated circuit for all the parts powered by regulated internal voltage $V_{REG}$. However, the state of all the output terminals of the parts powered by supply voltage $V_{DD}$ is maintained via the memory cells. The storage signal L_en is consequently still maintained in state "1".

In a third step of the method, the backup device is woken up for passage from idle mode to normal operating mode. In this third step of the method, the output terminal configuration is still maintained by the memory cells controlled by storage signal L_en in state "1", for example close to $V_{DD}$.

Finally, in a fourth step of the method, the storage signal passes from state "1" to state "0". In this condition, the output terminal configuration can change depending upon the data or control signals at the input of each voltage level shift unit.

Although means for blocking transverse currents are provided in each voltage level shift unit, these blocking means only become operational after storage of the output terminal configuration, i.e. after the first step of the method. The blocking means can be actuated either before the second step of the method, or at the same time or slightly after the second step of the method depending upon the configured logic part of the integrated circuit. To do this, the signal n_block has to pass from state "1" to state "0".

The transverse current blocking means may become inactive after the third step of the method with the signal n_block which passes from state "0" to state "1". This again enables the data or control signal to be transferred from the input stage at the output of the transfer part of each voltage level shift unit.

All of the steps of the method for enabling the backup device are simple to devise with timing of all of the signals, which is controlled by software. No addition of complementary operational units is provided, which could complicate the design of the integrated circuit. Moreover, because of the backup device of the present invention, good logic levels are guaranteed for example during the passage from idle mode to normal operating mode.

Figure 2:
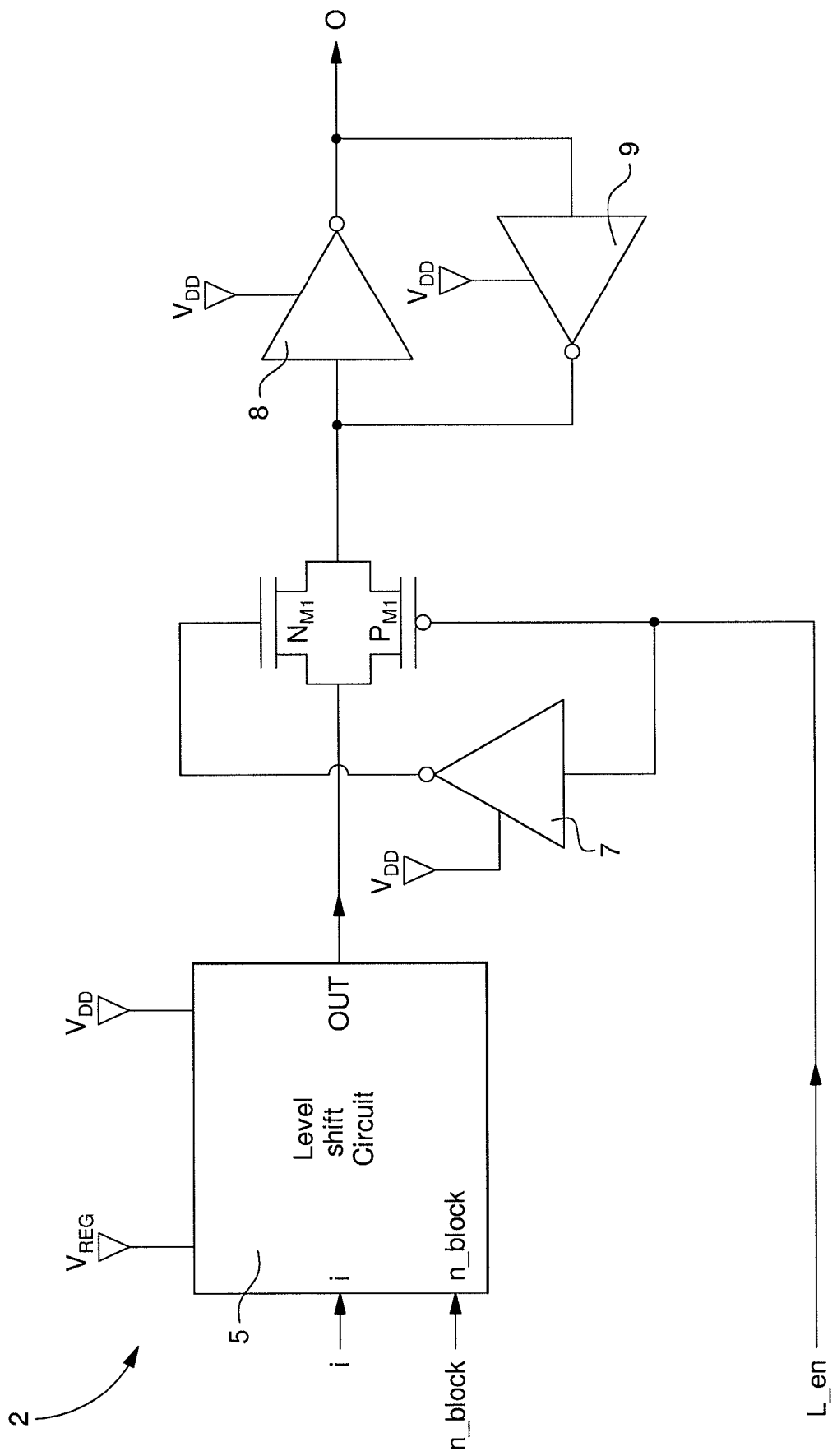
FIG. 2 shows in a simplified manner a voltage level shift unit, which includes a memory cell for the backup device according to the invention.

FIG. 2 shows schematically a voltage level shift unit 2. This shift unit, which was already described with reference to FIG. 1, mainly includes a voltage level shift circuit 5, which may be of conventional design in normal operating mode, and a memory cell connected to output OUT of level shift circuit 5. The voltage level shift circuit 5 includes an input stage that receives a data or control signal i, which is powered by regulated voltage $V_{REG}$, and a transfer part for a function state at output OUT, which is powered by the integrated circuit supply voltage $V_{DD}$. In addition to the conventional voltage level shift part, this transfer part also includes the transverse current blocking means, which will be described in more detail with reference to FIG. 3.

It should be noted that the state of a function at output OUT in the transfer part concerns the voltage shift of a data signal i or a control signal i. The state of output OUT is however blocked in state "0" if the signal n_block is in state "0" whatever the data or control signal i at input.

The memory cell of the voltage level shift unit is, in a conventional manner, made up first of all of a pair of parallel-mounted NMOS and PMOS transistors $N_{M1}$ and $P_{M1}$ of different conductivity. The gate of the first transistor $P_{M1}$ is controlled by storage signal L_en, whereas the gate of the second transistor $N_{M1}$ is controlled by the reverse of storage signal L_en. To do this a first rapid inverter 7 is connected on one side to the gate of first transistor $P_{M1}$ and at output to the gate of the second transistor $N_{M1}$. This first inverter is powered by the integrated circuit supply voltage $V_{DD}$.

The drains of these two NMOS and PMOS transistors $N_{M1}$ and $P_{M1}$ are connected to output OUT of level shift circuit 5, whereas the sources of these two transistors are connected to the input of a second rapid inverter 8 powered by supply voltage $V_{DD}$. The output of this second inverter is output O of the voltage level shift unit. A third weak inverter 9 is also connected between output O and the input of second inverter 8. This third weak inverter 9 is also powered by supply voltage $V_{DD}$.

The principle of storing a state of terminal O via the memory cell will not be explained in detail, since it forms part of the general knowledge of those skilled in the art in this technical field. It should just be noted that to store an output state of the voltage level shift unit, the storage signal L_en must be maintained in state "1", i.e. normally at supply voltage $V_{DD}$. When signal L_en is in state "1", both transistors are made non-conductive for storing an output state at their source terminal.

The voltage level shift unit is now explained in more detail with reference to FIG. 3. FIG. 3 shows mainly level shift circuit 5 and memory cell 6 as described above.

Voltage level shift unit 2 includes first of all an input stage powered by regulated voltage $V_{REG}$. This input stage is made up of an inverter that has two PMOS and NMOS transistors $P_{E1}$ and $N_{E1}$ of different conductivity, series-connected between the regulated voltage terminal $V_{REG}$ and earth terminal $V_{SS}$. The source of transistor $P_{E1}$ is connected to the regulated voltage terminal, whereas the source of transistor $N_{E1}$ is connected to the earth terminal. The gate of both these transistors $P_{E1}$ and $N_{E1}$ is controlled by data or control signal i. This data or control signal also controls a first NMOS transistor $N_{D1}$ via its gate and a first PMOS transistor $P_{D1}$ via its gate of the voltage level shift part for transferring an output state. The connection node of the drains of these input transistors $P_{E1}$ and $N_{E1}$ is connected to the gate of a second NMOS transistor $N_{D2}$ and to the gate of a second PMOS transistor $P_{D2}$ of the conventional level shift part.

The voltage level shift part thus includes the first PMOS transistor $P_{D1}$, whose source is connected to the terminal of the supply voltage $V_{DD}$, the second PMOS transistor $P_{D2}$, whose source is also connected to the supply voltage terminal $V_{DD}$. This voltage level shift part also includes a differential pair of PMOS transistors $P_{D3}$ and $P_{D4}$, which is a well-known bistable part. The source of third transistor $P_{D3}$ is connected to the drain of the first PMOS transistor $P_{D1}$ whereas the source of the fourth transistor $P_{D4}$ is connected to the drain of the second PMOS transistor $P_{D2}$. The gate of the third PMOS transistor $P_{D3}$ is connected to the drain of the fourth transistor $P_{D4}$ and also to the drain of the second NMOS transistor $N_{D2}$, whereas the gate of the fourth transistor $P_{D4}$ is connected to the drain of the third transistor $P_{D3}$, and to the drain of the first NMOS transistor $N_{D1}$. The source of the second NMOS transistor $N_{D2}$ is directly connected to earth terminal $V_{SS}$, whereas the source of the first transistor $N_{D1}$, which should conventionally be connected to the earth terminal, is however connected to the drain of a blocking transistor $N_{B2}$ of the blocking means.

The connection node of the drain of the first NMOS transistor ND1 and the drain of the third PMOS transistor $P_{D3}$ is connected to an output inverter, which supplies output signal OUT. This output inverter is made up of two PMOS and NMOS transistors $P_{D5}$ and $N_{D3}$ of different conductivity, series-connected between the supply voltage terminal $V_{DD}$ and earth terminal $V_{SS}$. The source of the fifth PMOS transistor $P_{D5}$ is connected to the supply voltage terminal $V_{DD}$, whereas the source of the third NMOS transistor $N_{D3}$ is connected to the earth terminal. The gate of these two transistors $P_{D5}$ and $N_{D3}$ is controlled by the drain connection node of transistors $P_{D3}$ and $N_{D1}$, whereas the drain connection node of these two transistors $P_{D5}$ and $N_{D3}$ forms the output terminal OUT of the level shift circuit.

The blocking means form part of the output function state transfer part in level shift circuit 5. These blocking means include, first of all, first, second and third NMOS transistors $N_{B1}$, $N_{B2}$ and $N_{B3}$, whose source is each directly connected to earth terminal $V_{SS}$, and first and second PMOS transistors $P_{B1}$ and $P_{B2}$, whose source is each directly connected to supply voltage terminal $V_{DD}$.

The gate of the first and second NMOS transistors $N_{B1}$ and $N_{B2}$ is connected to the gate of the first and second PMOS transistors $P_{B1}$ and $P_{B2}$. The gate of these transistors is directly controlled by the blocking signal n_block. The drain of the first PMOS transistor $P_{B1}$ is connected to the drain of the first NMOS transistor $N_{B1}$, and to the gate of the third NMOS transistor $N_{B3}$. The drain of the third NMOS transistor $N_{B3}$ is connected to the drain of the second NMOS transistor $N_{D2}$, to the drain of the fourth PMOS transistor $P_{D4}$ and to the gate of the third PMOS transistor $P_{D3}$ of the level shift part. The drain of the second blocking NMOS transistor $N_{B2}$ is connected to the source of the first NMOS transistor $N_{D1}$ of the level shift part. Finally, the drain of the second blocking PMOS transistor $P_{B2}$ is connected to the connection node of the drain of the first NMOS transistor $N_{D1}$, the drain of the third PMOS transistor $P_{D3}$ and the gate of the fourth PMOS transistor $P_{D4}$ of the level shift part.

When the blocking signal n_block is in state "1", i.e. for example at supply voltage $V_{DD}$, the level shift circuit operates in a conventional manner. The first and second NMOS transistors $N_{B1}$ and $N_{B2}$ are conductive which means that the source of the first NMOS transistor $N_{D1}$ can be connected to the earth terminal and the third NMOS blocking transistor $N_{B3}$ can be made conductive. The two blocking transistors $P_{B1}$ and $P_{B2}$ are however non conductive.

To ensure that all the transistors in the level shift circuit are blocked in a well defined state so that there are only leakage currents in low-power mode, blocking signal n_block is operated by the integrated circuit logic such that it is in state "0" close to earth. When blocking signal n_block is in state "0", the two PMOS blocking transistors $P_{B1}$ and $P_{B2}$ become conductive, whereas the two NMOS blocking transistors $N_{B1}$ and $N_{B2}$ become non-conductive. The third NMOS blocking transistor $N_{B3}$ becomes conductive to pull the gate of the third PMOS transistor $P_{D3}$ and the drain of the fourth PMOS transistor $P_{D4}$ towards earth. The second PMOS blocking transistor $P_{B2}$ becomes conductive and pulls the connection node of the drain of the first NMOS transistor $N_{D1}$, the drain of the third PMOS transistor $P_{D3}$ and the gate of the fourth PMOS transistor $P_{D4}$ of the level shift part up to supply voltage $V_{DD}$. Thus, output OUT of the shift circuit is blocked in state "0", whatever the state of the data or control signal i.

Memory cell 6, which is connected to output OUT of voltage level shift circuit 5, includes the same elements as described with reference to FIG. 2. Consequently, only the inverters connected to the pair of transistors $P_{M1}$ and $N_{M1}$, whose drain is connected to output OUT, will be described in detail.

The first quick inverter of memory cell 6 includes a second PMOS transistor $P_{M2}$ and a second NMOS transistor $N_{M2}$ series-mounted between the supply voltage terminal $V_{DD}$ and earth terminal $V_{SS}$. The source of the second transistor $P_{M2}$ is directly connected to the supply voltage terminal $V_{DD}$, whereas the source of the second transistor $N_{M2}$ is directly connected to earth terminal $V_{SS}$. The gate of these two transistors $N_{M2}$ and $P_{M2}$ is controlled by storage signal L_en, and the gate of the first PMOS transistor $P_{M1}$, whereas the drain of these two transistors controls the gate of the first NMOS transistor $N_{M1}$.

The second quick inverter of memory cell 6 also includes two MOS transistors, series-mounted between the supply voltage terminal $V_{DD}$ and earth terminal $V_{SS}$. The source of the third PMOS transistor $P_{M3}$ is directly connected to the supply voltage terminal $V_{DD}$, whereas the source of the third NMOS transistor $N_{M3}$ is directly connected to earth terminal $V_{SS}$. The gate of these two transistors $N_{M3}$ and $P_{M3}$ is connected to the source of the first transistors $N_{M1}$ and $P_{M1}$, whereas the drain of these two transistors $N_{M3}$ and $P_{M3}$ forms the output O of voltage level shift unit 2.

The third weak inverter of memory cell 6 is connected in the opposite direction between the output and the input of the second inverter. This third weak inverter is made up of a pair of NMOS transistors $N_{M4}$ and $N_{M5}$ in series and a pair of PMOS transistors $P_{M4}$ and $P_{M5}$ in series. These two pairs of transistors are series-mounted between the supply voltage terminal $V_{DD}$ and earth terminal $V_{SS}$. The source of the fourth PMOS transistor $P_{M4}$ is directly connected to the supply voltage terminal, whereas the source of the fourth NMOS transistor $N_{M4}$ is directly connected to the earth terminal. The drain of the fourth PMOS transistor $P_{M4}$ is connected to the source of the fifth transistor $P_{M5}$, whereas the drain of the fourth NMOS transistor $N_{M4}$ is connected to the source of the fifth NMOS transistor $N_{M5}$. The drain of the fifth transistors $N_{M5}$ and $P_{M5}$ is connected to the input of the second inverter, i.e. to the gate of the third transistors $N_{M3}$ and $P_{M3}$, whereas the gate of transistors $N_{M4}$, $N_{M5}$, $P_{M4}$ and $P_{M5}$ is connected to the output of the second inverter, i.e. to output O of voltage level shift unit 2.

It should be noted that the arrangement of the two pairs of transistors of the third inverter was chosen so as to define two PMOS and NMOS transistors with a long channel length L and short channel width W. However, the PMOS and NMOS transistors of the first and second inverters are defined, in comparison, with a short channel length L and large channel width W. However, since this arrangement is well known in this technical field, it will not be explained in further detail.

From the description that has just been given, several variants of the backup device and the method for enabling said device might be devised by those skilled in the art without departing from the scope of the invention defined by the claims. The blocking signal for the blocking means may occur at any time depending upon the programming of the integrated circuit logic or spontaneously during passage from normal operating mode to idle mode after storage of the output terminal configuration. The integrated circuit supply voltage may be at a lower or higher level than the regulated internal voltage, which is cut off in the backup device idle mode.

What is claimed is:

1. A device for backing up the configuration of terminals of a low-power integrated circuit, the device including:
   at least one voltage level shift unit, which includes a voltage level shift circuit and a memory cell for storing an output state of a unit function, the voltage level shift circuit including an input stage that receives a data or control signal, and which is powered by a regulated internal voltage and a part for transferring the output state of a unit function according to the state of the data or control signal, which is powered by a supply voltage of the integrated circuit, said transfer part of a state of a function being connected to the input stage for voltage shifting the data or control signal provided at input stage, and
   an output stage powered by the integrated circuit supply voltage, which is connected to the output of the voltage level shift unit and connected to at least one external contact pad of the integrated circuit,
   wherein the backup device includes several voltage level shift units connected to the output to the output stage, the voltage level shift units each including a memory cell powered by the supply voltage and controlled by a same storage signal, for storing the output voltage state of a specific function of the respective level shift unit in an idle mode of the integrated circuit where the regulated voltage is cut off.

2. The backup device according to claim 1, wherein each memory cell is connected to the output of the state transfer part for the specific function of the corresponding voltage level shift unit.

3. The backup device according to claim 1, wherein it includes at least two voltage level shift units, whose each memory cell is controlled by a same storage signal for storing the output terminal state of the units for the idle mode, a first unit whose function is to transmit a data signal at the output to a buffer of the output stage in normal operating mode, and a second unit whose function is to supply a first control signal at the output to the buffer of the output stage to control transmission of the data signal to the external contact pad of the integrated circuit.

4. The backup device according to claim 3, wherein it further includes a third voltage level shift unit whose function is to control, via a second control signal the output stage to pull up the external contact pad of the integrated circuit in normal operating mode, and wherein it further includes a fourth voltage level shift unit whose function is to control, via a third control signal the output stage to pull down the external contact pad of the integrated circuit in normal operating mode.

5. The backup device according to claim 3, wherein the output stage includes a tri-state buffer that receives at input a voltage shifted data signal from the first voltage level shift unit in normal operating mode, said tri-state buffer being controlled by a first control signal supplied by the second voltage level shift unit, the output of the buffer being connected to the external contact pad, and wherein the output stage includes a first PMOS transistor and a second NMOS transistor series-mounted between a supply voltage terminal and an earth terminal, and a resistor that connects the drain of the two transistors to the external contact pad, the first transistor being controlled by the third voltage level shift unit for pulling up, whereas the second transistor is controlled by the fourth voltage level shift unit for pulling down.

6. The backup device according to claim 1, wherein each voltage level shift unit includes, in the output function state transfer part, blocking means powered by the integrated circuit supply voltage, said blocking means being provided for fixing a determined state in output by voltage level shift transistors of the transfer part following the storage of a state of a function in memory cell in an idle mode.

7. The backup device according to claim 6, wherein the blocking means of each voltage level shift unit are controlled by a same blocking signal for fixing a determined state in output of each unit independently of any data or control signal in idle mode, when the regulated internal voltage is cut off.

8. The backup device according to claim 6, wherein the transfer part of a state of a function of each voltage level shift unit, includes two PMOS transistors series-connected between two terminals of an integrated circuit supply voltage source, differential pair of crossed-connection PMOS transistors, and two NMOS transistors, the gate of a first PMOS transistor and the gate of a first NMOS transistor being connected to receive the data or control signal, whereas the gate of a second PMOS transistor and the gate of a second NMOS transistor being connected to receive the reversed data or control signal, the drain of the first NMOS transistor and the drain of a first differential PMOS transistor connected to the gate of a second differential PMOS transistor being connected to an inverter to supply the data or control signal in output voltage shifted.

9. The backup device according to claim 8, wherein the blocking means include a pair of PMOS transistors connected to the high potential terminal of supply voltage, and a pair of NMOS transistors connected to the earth terminal, the gates of PMOS and NMOS transistors being connected to be controlled by a same blocking signal, the drains of first PMOS and NMOS transistors of each pair being connected to control the gate of a blocking NMOS transistor connected in parallel of the second NMOS transistor of the transfer part and connected to the gate of the first differential PMOS transistor, the second NMOS transistor of the pair being series-connected with the first NMOS transistor of the transfer part to connect to earth the source of first NMOS transistor, when the blocking signal makes conductive the pair of NMOS transistors in a normal operating mode, and the drain of second PMOS transistor of the pair being connected to the drains of the first NMOS transistor and first differential PMOS transistor of the transfer part, and to the gate of a second differential PMOS transistor to fix a determined state in output, when the PMOS transistors of the pair are made conductive in an idle mode.

10. The backup device according to claim 4, wherein the output stage includes a tri-state buffer that receives at input a voltage shifted data signal from the first voltage level shift unit in normal operating mode, said tri-state buffer being controlled by a first control signal supplied by the second voltage level shift unit, the output of the buffer being connected to the external contact pad, and wherein the output stage includes a first PMOS transistor and a second NMOS transistor series-mounted between a supply voltage terminal and an earth terminal, and a resistor that connects the drain of the two transistors to the external contact pad, the first transistor being controlled by the third voltage level shift unit for pulling up, whereas the second transistor is controlled by the fourth voltage level shift unit for pulling down.

11. A method of enabling a device for backing up the terminal configuration of a low-power integrated circuit according to any of the preceding claims, wherein, for passage from normal operating mode to idle mode, it includes the following steps:

enabling by means of a same storage signal storage by each memory cell of the last output state of the output terminals of the voltage level shift units, enabling passage from normal operating mode to low-power or idle mode, wherein the regulated internal voltage is cut off or becomes floating, the last output state of the terminals being maintained by the enabled memory cells by the storage signal, waking up after a determined period of time or after an external command, the backup device for passage from idle mode to normal operating mode with the operating regulated voltage, the last output state of the output terminals being maintained by the memory cells enabled by the storage signal, and deactivating the storage signal to change, in accordance with the data or control signals, the output terminal configuration of each voltage level shift unit.

12. The method according to claim 11, wherein the backup device includes means for blocking of the output function state transfer part in each voltage level shift unit, wherein the blocking means are enabled to fix an output determined state after the command by the storage signal for storage of the output terminal configuration in each memory cell, and wherein the blocking means become inactive after the backup device has woken up, but prior to deactivation of the storage signal.

13. The method according to claim 12, wherein the blocking means are enabled at the same time as the command to pass from normal operating mode to idle mode or after a period of time that follows said operation.

* * * * *